US010602639B2

(12) United States Patent
Chang et al.

(10) Patent No.: US 10,602,639 B2
(45) Date of Patent: Mar. 24, 2020

(54) EXTENSION PORTION OF HEATSINK ABOVE A PROCESSING COMPONENT (71) Applicant: HEWLETT PACKARD ENTERPRISE DEVELOPMENT LP, Houston, TX (US)

(72) Inventors: Kai Po Chang, Taipei (CN); Guo Sheng Mo, Taipei (CN); Chi Wei Cheng, Taipei (CN); Ting Shih Chang, Taipei (CN)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/079,642

(22) PCT Filed: Apr. 15, 2016

(86) PCT No.: PCT/US2016/027759
§ 371 (c)(1),
(2) Date: Aug. 24, 2018

(87) PCT Pub. No.: WO2017/180148
PCT Pub. Date: Oct. 19, 2017

(65) Prior Publication Data
US 2019/0053401 A1 Feb. 14, 2019

(51) Int. Cl.
*G06F 1/16* (2006.01)
*H05K 5/00* (2006.01)
(Continued)

(52) U.S. Cl.
CPC .......... *H05K 7/20154* (2013.01); *G06F 1/20* (2013.01); *H05K 7/20727* (2013.01)

(58) Field of Classification Search
CPC .. H05K 7/20154; H05K 7/20163; G06F 1/20; G06F 1/203; G06F 1/206
(Continued)

(56) References Cited

U.S. PATENT DOCUMENTS 6,058,012 A * 5/2000 Cooper ................... G06F 1/203
165/80.3
6,313,994 B1 11/2001 Tantoush
(Continued)

FOREIGN PATENT DOCUMENTS

JP 2010152886 A 7/2010

OTHER PUBLICATIONS

International Search Report and Written Opinion, International Application No. PCT/US2016/027759, dated Dec. 27, 2016, pp. 1-9, KIPO.
(Continued)

*Primary Examiner* — Anthony M Haughton
(74) *Attorney, Agent, or Firm* — Hewlett Packard Enterprise Patent Department (57) ABSTRACT

Examples herein disclose a heatsink including an extension portion and a base portion. The extension portion extends above a processing component to a fan, such that the extension prevents a heated air produced by the processing component to combine with cool air from the fan. The base portion, coupled to the extension portion, receives cool air from the fan via the extension portion and transfers heat from a different processing component in a posterior location to the processing component.

19 Claims, 6 Drawing Sheets

(51) Int. Cl.
*H05K 7/00* (2006.01)
*H05K 7/20* (2006.01)
*G06F 1/20* (2006.01)

(58) Field of Classification Search
USPC .................... 361/709, 711, 697, 695, 714
See application file for complete search history.

(56) References Cited

U.S. PATENT DOCUMENTS

| | | | |
|---|---|---|---|
| 6,359,781 B1 | 3/2002 | Hoss et al. | |
| 6,999,312 B1* | 2/2006 | Garnett | H01L 23/467 |
| | | | 165/80.3 |
| 7,461,272 B2 | 12/2008 | Rotem et al. | |
| 7,518,862 B1* | 4/2009 | Macika | G06F 1/20 |
| | | | 361/688 |
| 8,295,050 B2 | 10/2012 | Chuang et al. | |
| 10,237,965 B2* | 3/2019 | Luskind | G06F 1/203 |
| 2003/0169567 A1* | 9/2003 | Tantoush | G06F 1/20 |
| | | | 361/695 |
| 2005/0041391 A1* | 2/2005 | Wrycraft | G06F 1/20 |
| | | | 361/695 |
| 2005/0254213 A1* | 11/2005 | Wang | G06F 1/20 |
| | | | 361/697 |
| 2006/0104024 A1 | 5/2006 | Wang et al. | |
| 2007/0188995 A1 | 8/2007 | Franz et al. | |
| 2008/0041562 A1* | 2/2008 | Bhatia | G06F 1/20 |
| | | | 165/80.3 |
| 2009/0154103 A1* | 6/2009 | Liu | H01L 23/427 |
| | | | 361/700 |
| 2009/0168355 A1* | 7/2009 | Ma | H01L 23/3672 |
| | | | 361/709 |
| 2010/0103606 A1 | 4/2010 | Olesiewicz et al. | |
| 2011/0080700 A1 | 4/2011 | Bland et al. | |
| 2013/0250517 A1* | 9/2013 | Yang | G06F 1/20 |
| | | | 361/697 |
| 2014/0268553 A1 | 9/2014 | Van et al. | |
| 2015/0327394 A1* | 11/2015 | Davis | H01L 23/4006 |
| | | | 361/720 |
| 2016/0088774 A1 | 3/2016 | Alvarado et al. | |
| 2016/0088775 A1* | 3/2016 | Bailey | B21D 53/022 |
| | | | 361/679.47 |
| 2017/0164520 A1* | 6/2017 | Barron | H05K 7/20509 |
| 2019/0059178 A1* | 2/2019 | Moore | G06F 1/20 |

OTHER PUBLICATIONS

Joday, "Zipper Fin Heat Sinks Answer the Need for Reasonable Cost and Good Performance," Jan. 20, 2015, pp. 1-2 (online), Retrieved from the Internet on Mar. 22, 2016 at URL: <qats.com/cms/2015/01/20/zipper-fin-heat-sinks-answer-the-need-for-reasonable-cost-and-good-performance/>.

European Search Report and Search Opinion Received for EP Application No. 16898833.5, dated Aug. 30, 2019, 10 pages.

* cited by examiner

EXTENSION PORTION OF HEATSINK ABOVE A PROCESSING COMPONENT

BACKGROUND

As global demand for data exchange has grown, so does a size of a load placed on a server. As such, servers generate exponentially more power thus producing more heat.

BRIEF DESCRIPTION OF THE DRAWINGS

In the accompanying drawings, like numerals refer to like components or blocks. The following detailed description references the drawings, wherein.

DETAILED DESCRIPTION

As servers generate more heat, efficiently cooling the electrical components has become a concern. Several approaches have been implemented to provide cooling advances. One such approach provides liquid cooling which routes a coolant through pipes in and around the electrical components to prevent overheating. The liquid cooling approach uses a specially designed infrastructure which increases the cost and space of the cooling system.

In an air cooling approach, excess heat is removed from the system by forcing air through a server enclosure and over heat generating components (e.g., electrical components). Air cooled heat sinks enhance heat transfer into the passing air and heat is removed from the system as air exits the enclosure. A typical air cooled system may use a serial heating approach in which cool air is routed in a front-to-rear cooling process. In the serial heating approach, cool air is routed from the front electrical components to the rear components; however, the serial heating approach has its limitations as air heated by the front electrical components may be too hot to adequately cool the electrical components in the rear. This heating approach produces a pre-heated effect from the front electrical component to other downstream electrical components. For example, air delivered to the electrical components in the rear of the system is often above room temperature, resulting in inefficient cooling.

To address these issues, examples disclose a cooling system to efficiently cool processing components downstream from one another. The cooling system includes a first heatsink and a second heatsink. The first heatsink receives cool air for cooling an upstream processing component. The second heatsink receives cool air via an extension portion extending across the first heatsink. Receiving the cool air via the extension portion ensures the preheated air produced from cooling the upstream processing component does not combine with the cool air received via the extension portion. In this manner, the extension portion provides a division of the cool airflows delivered to the processing components. Additionally, using the extension portion for the air cooling approach, prevents limitations imposed by liquid cooling.

In another example, the first heatsink reaches a height of 1U while the second heatsink reaches a height of 2U. Reaching a taller height than the first heatsink, ensures the extension portion of the second heatsink receives fresh cool air for efficiently cooling downstream processing components.

The following detailed description refers to the accompanied figures. Wherever possible, the same reference numbers are used in the figures and the following description to refer to the same or similar parts. It is to be expressly understood, however, that the figures are for the purpose of illustration and description only. While several examples are described throughout, modification, adaptions, and other implementations are possible. Accordingly, the following detailed description is not meant to limit the disclosed examples, rather it is meant to provide proper scope of the disclosed examples and may be defined by the appended claims.

Figure 1A:
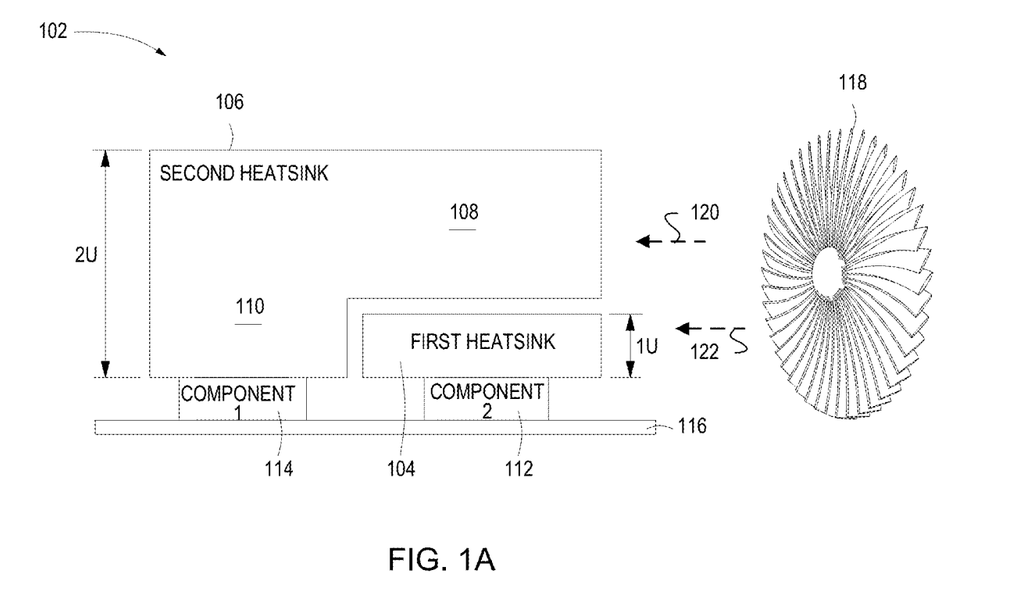
FIGS. 1A-1B illustrate side perspectives of an example cooling system including a first heatsink and a second heatsink comprising an extension portion and a base portion in accordance with the present disclosure.

FIG. 1A illustrates a side perspective of example cooling system 102. Cooling system 102 includes first heatsink located above processing component 112 and second heatsink 106 located above different processing component 114. Second heatsink 106 includes extension portion 108 and base portion 110. Extension portion 108 receive cool air from fan 118 and transfers cool air to base portion 110. Extension portion 108 receives cool air (as indicated with dashed arrow 120) above first heatsink 104 to prevent heated air produced by processing component 112 from combining with the cool air from fan 118. Base portion 110 receives cool air from extension portion 108 for cooling different processing component 114. Cooling system 102 represents a system to remove heated air produced by components 112 and 114 within a data center type environment, such as a server. As such implementations of the environment in which to enable cooling system 102 includes a server, database server, mail server, file server, domain name system (DNS) server, print server, web server, game server, application server, cartridge server, blade server, catalog server, communication server, home server, media server, proxy server, or other type of data center capable of data exchange. Although FIG. 1A illustrates cooling system 102 as including first heatsink 104 and second heatsink 106, implementations should not be limited as this was done for illustration purposes. For example, cooling system 102 may further include additional heatsinks, components, etc.

First heatsink 104, located above processing component 112, is comprised of a material or substance which absorbs heat produced by processing component 112. First heatsink 104 may include a passive heat exchanger that transfers the heat produced by processing component 112. The transferred heat may exit first heatsink 104 to provide regulation of first heatsink 104 and/or processing component 112. First heatsink 104 may be comprised of a material which absorbs the heat produced by processing component. Such examples of the material may include copper, aluminum, aluminum alloy, diamond, copper-tungsten, silicon carbide, dymalloy, beryllium oxide, beryllium matrix, ceramic, etc. In one implementation first heatsink 104 reaches a height of 1U and second heatsink reaches a height of 2U. Each U is a unit of measure in height of electronic equipment, thus 1U equates to 1 rack unit while 2U equates to a height of 2 rack units.

Second heatsink 106 includes extension portion 108 and base portion 110. Second heatsink 106 may include a passive heat exchanger that transfers the heat produced by different processing component 114. The transferred heat may exit the second heatsink 106, thus providing temperature regulation of second heatsink 106 and/or different processing component 114. Although FIG. 1A illustrates a space between first heatsink 104 and second heatsink 106, this was done for illustration purposes as first heatsink 104 may be in direct contact with extension portion 108 and/or base portion 110 of second heatsink 106.

Extension portion 108, may also be referred to as first portion of second heatsink 106. In one implementation, extension portion 108 reaches across first heatsink 104 to receive cool air from fan 118. In this implementation, extension portion 108 may receive cool air from fan 118 simultaneously as first heatsink 104 receives cool air. Receiving cool air from fan 118 simultaneously as first heatsink 104, prevents the heated air produced by processing component 112 to combine with the cool air received by extension portion 108. Extension portion 108 and base portion 110 provide the framework of second heatsink 106. As such, these portion 108 and 110 form an L-shape across first heatsink 104. Extension portion 108 may be comprised of material and/or substance which may deflect heated produced by processing component 112 and absorbed by first heatsink 104. For example, extension portion 108 may be comprised of copper while base portion 110 may be comprised of aluminum. In this implementation, extension portion 108 absorbs cool air from fan 118 such that the cool air may be received by base portion 110. In a further implementation, extension portion 108 may be comprised of a different material than base portion 110. In other implementations, extension portion 108 and base portion 110 may be comprised of the same material to constitute second heatsink 106. Examples of such material may include copper, aluminum, aluminum alloy, diamond, copper-tungsten, silicon carbide, dymalloy, beryllium oxide, beryllium matrix, ceramic, etc. Additionally, although FIG. 1A illustrates extension portion 108 and base portion 110 without a delineation between these portions 108 and 110, this was done for illustration purposes as the portions 108 and 110 may include a boundary or border between portions 108 and 110.

Base portion 110, may also be referred to as second portion of second heatsink 106, receives cool air from extension portion 108. Upon receiving cool air from extension portion 108, base portion 110 cools different processing component 114. Base portion 110 absorbs or transfers the heated air produced by different processing component 114, thereby regulating the temperature of different processing component 114.

Processing component 112 and different processing component 114 are considered electrical components located on board 116. Each component 112 and 114 produces heated air when in operation. As such, the cooling system 102 provides a mechanism to remove the heated air produced by these components 112 and 114, thereby preventing degradation and/or potential failure of these components 112 and 114. Processing component 112 may be positioned closer to fan 118 than different processing component 114. In this manner, different processing component 114 is considered downstream from the cool air of the fan 118. In this implementation, the processing component 112 is positioned in an initial location to the cool air while different processing component 114 is in a posterior location to the cool air and processing component 112. For example, assume cooling system 102 is without extension portion 108, this means cool air from fan 118 would move across first heatsink 104 and processing component 112 prior to reaching second heatsink 106 and different processing component 114. Implementations of processing component 112 and different processing component 114 may include, by way of example, an integrated circuit, semiconductor, memory module, central processing unit (CPU), processing resource, application-specific integrated circuit (ASIC), controller, processor, chipset, or other type of hardware component. In a further implementation, processing component 112 and different processing component 114 include the same type of component, while in further implementations, each processing component 112 and 114 may include a different type of component. For example, processing component 112 may include a controller while processing component 114 may include a CPU.

Board 116 is a printed circuit board 106 which mechanically supports and electrically connects components 112 and 114 using conductive tracks, pads, or other features. The electrical connections on board 116 are created through an etching of a copper sheet which is laminated onto a non-conductive substrate. Board 116 supports processing components 112 and 114 for operation within the server. As such, in one implementation, board 116 may include a motherboard for operation of the server.

Fan 118 provides cool air to first heatsink 104 and second heatsink 106 via extension portion 108. In one implementation, fan 118 may be coupled to the server to provide cool air. In another implementation, fan 118 may provide cool air simultaneously to first heatsink 104 and extension portion 108.

Figure 1B:
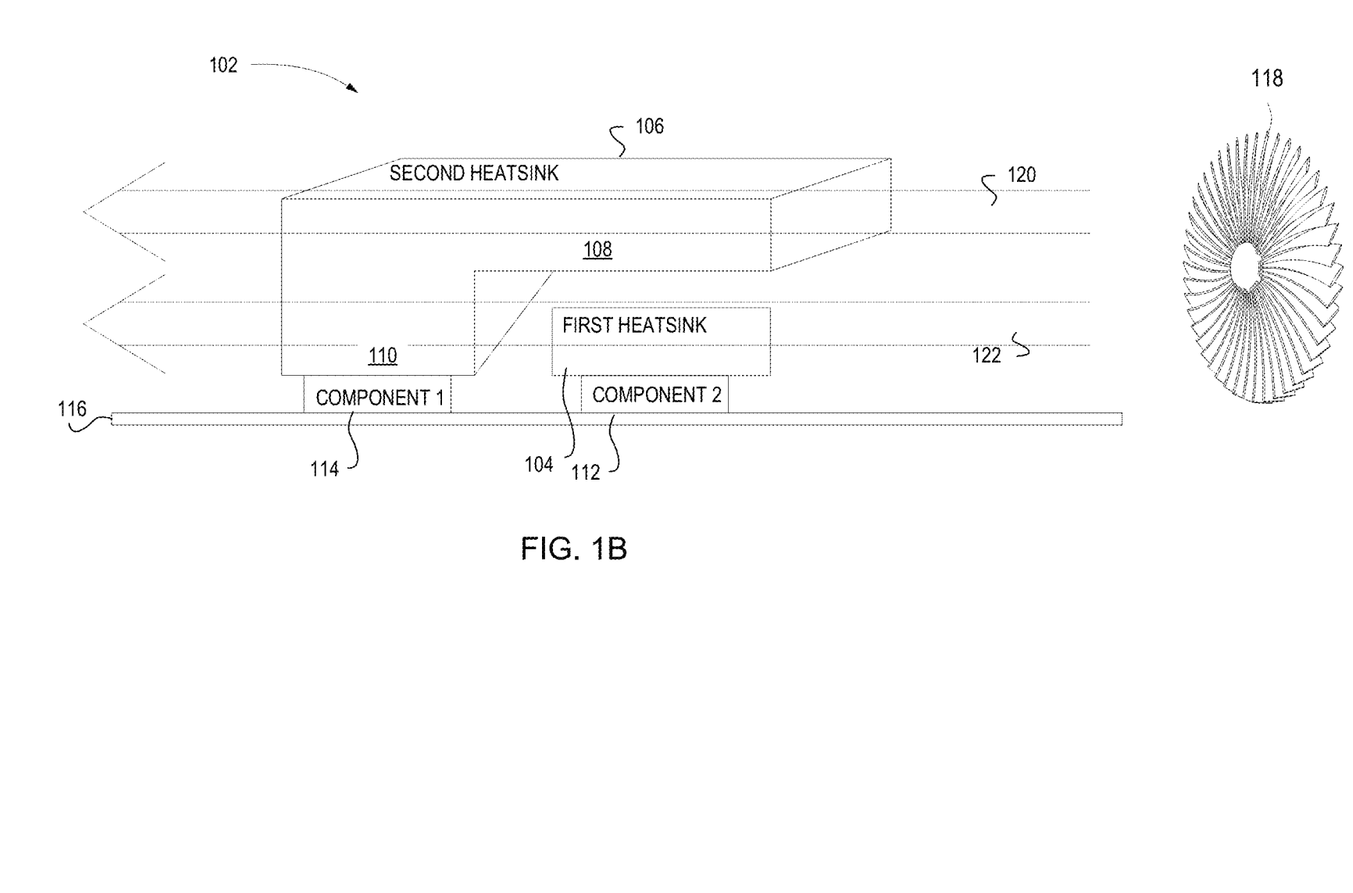

FIG. 1B illustrates a side perspective of cooling system 102 including cool airflows 120 and 122 received by first heatsink 104 and second heatsink 106 via extension portion 108. Cool airflows 120 and 122 are produced by fan 118 and pushed to heatsinks 104 and 106. In this implementation of the present disclosure, cool air is produced by fan 118 and received simultaneously by first heatsink 104 and extension portion 108 as represented by cool airflows 120 and 122. Cool airflows 120 and 122 represent a flow of air from fan 118 across heatsinks 104 and 106 to cool processing components 112 and 114. In another implementation, airflows 120 and 122 are initially cooler in temperature as received by heatsinks 104 and 106. As airflows 120 and 122 move across first heatsink 104 and extension portion 108, the temperatures of airflows 120 and 122 increase by absorbing heat produced by respective processing components 112 and 114. Although FIG. 1B illustrates fan 118 as producing two different airflows 120 and 122, implementations should not be so limited as this was done for illustration purposes. For example, airflows 120 and 122 may be part of the same airflow which is pushed by fan 118 to heatsinks 104 and 106.

Figure 2:
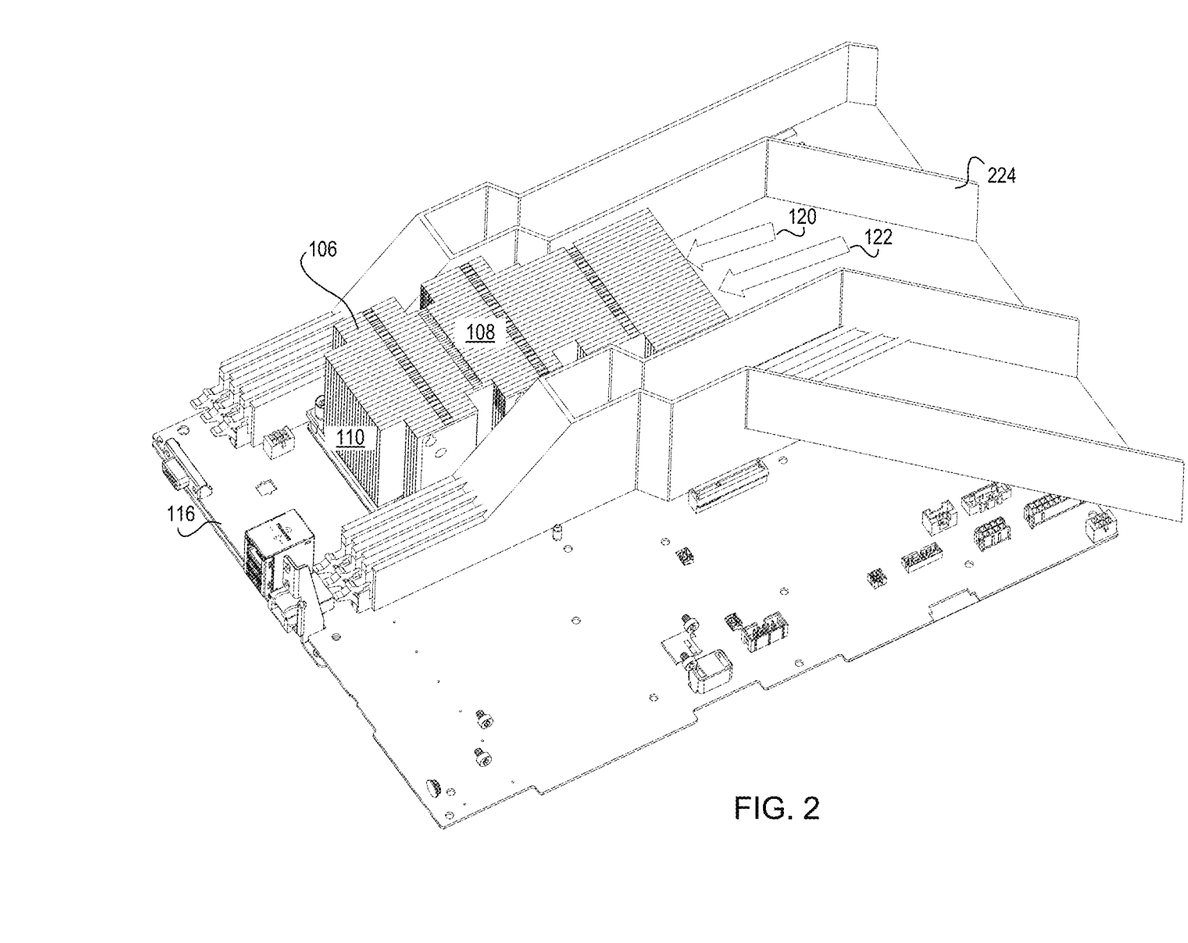
FIG. 2 illustrates a top perspective of an example cooling system including a first heatsink and a second heatsink in accordance with the present disclosure.

FIG. 2 illustrates a top perspective of cooling system including second heatsink 106 comprising base portion 110 and extension portion 108. Extension portion 108 receives cool airflow 120 from fan while first heatsink (not illustrated), which is positioned below extension portion 108, receives cool airflow 122. Cooling system also includes airflow guide 224 which receives cool airflows 120 and 122 from fan (not illustrated) and guides the airflows 120 and 122 to first heatsink and extension portion 108 of second heatsink 106.

First heatsink, located below extension portion 108 of second heatsink 106, is positioned above a heat producing processing component (not illustrated). As such, cool airflow 122 received through airflow guide 224 from the fan, allows the first heatsink to absorb the heat produced by processing component.

Second heatsink 106 comprises extension portion 108 and base portion 110. Extension portion 108 extends across the top of the first heatsink, thereby receiving cool airflow 120 through airflow guide 224 from the fan. Receiving cool airflow 120, extension portion 108 moves the cool airflow 120 above the first heatsink for the base portion 110 to receive. Base portion 110 uses cool airflow 120 to absorb heat produced by a different processing component (not illustrated) for temperature regulation.

Figure 3A:
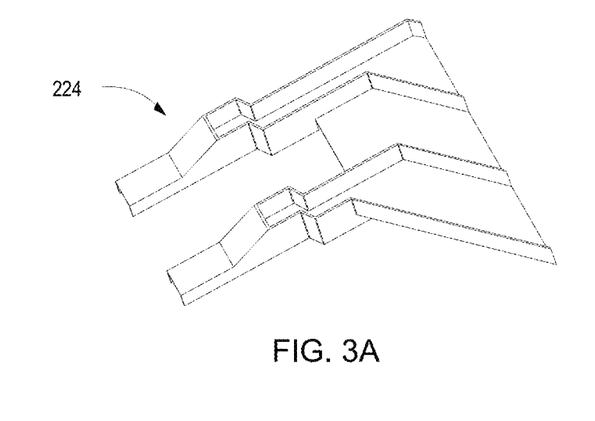
FIGS. 3A-3B illustrate various perspectives of an example cooling system within a server including a first heatsink located over a processing component and a second heatsink with an extension portion located over another processing component in a posterior location of airflow within the server.
Figure 3B:
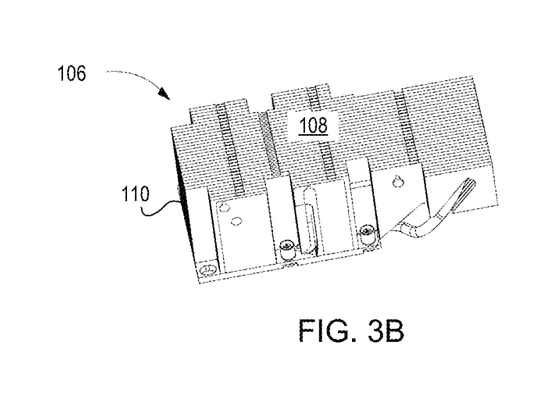
Figure 3C:
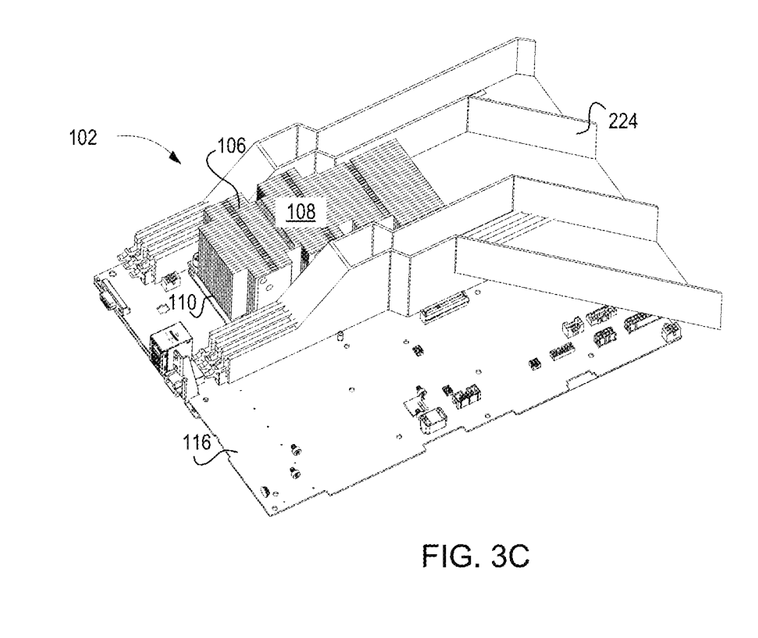

FIGS. 3A-3C illustrate various perspectives and installations of airflow guide 224, second heatsink 106, and cooling system 102. FIGS. 3A-3B illustrate perspectives of airflow guide 224 and second heatsink 106 (e.g., heatsink) prior to installation on board 116. FIG. 3C illustrates cooling system 102 upon installation of first heatsink (not illustrated), second heatsink 106, and airflow guide 224.

FIG. 3A illustrates airflow guide 224 prior to installation into cooling system 102. As such, airflow guide 224 includes angles walls in which to direct or guide cool air from a fan (not illustrated) to the various heatsinks. These angled walls serve as a mechanism to guide the flow of air from the fan. The airflow guide 224 takes into consideration the fan may be some distance from the various heatsinks. As such, this was done for illustration purposes as the angled walls may be much shorter in distance and/or the fan may be much closer in distance to the various heatsinks.

FIG. 3B illustrates extension portion 108 and base portion 110 comprising second heatsink 106 prior to installation. Extension portion 108 and base portion 110 may be coupled together to create second heatsink 106. As such, extension portion 108 includes a top wall and side walls for extending above a first heatsink and respective processing component. Base portion 110 is illustrated below extension portion 108 to absorb or transfer the heat produced by the processing component located below second heatsink 106.

FIG. 3C illustrates cooling system 102 including installation of airflow guide 224 and second heatsink 106 on board 116 within a server type environment. Cooling system 102 includes a combination of a first heatsink (not illustrated) and second heatsink 106 to cool respective heat producing components. The first heatsink is located under extension portion 108 such that first heatsink cools processing component (not illustrated) on board 116. Extension portion 108 and the first heatsink receive cool air through airflow guide 224 from a fan (not illustrated). Upon receiving the cool air, the air moves across the extension portion 108 to base portion 110. Base portion 110 is located above a different processing component (not illustrated). The different processing component is considered downstream in a flow of preheated air from the processing component. In this regard, different processing component is in a posterior location to the processing component.

Figure 4:
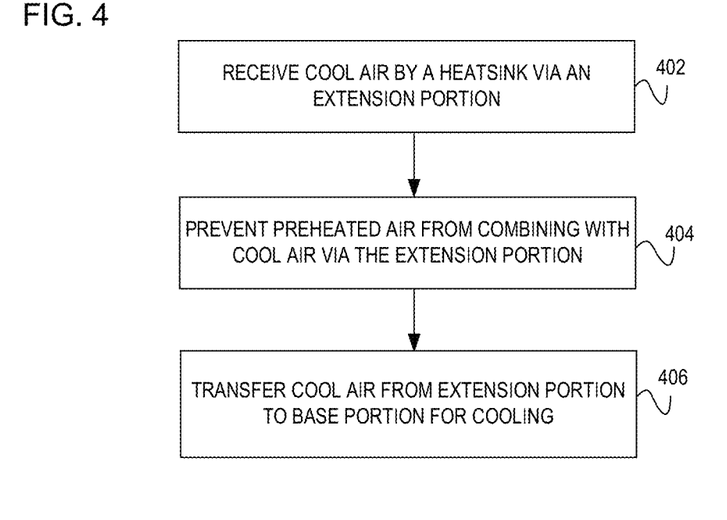
FIGS. 4-5 illustrate example flow diagrams for providing an extension to prevent a combination of heated air and cool air in accordance with the present disclosure.
Figure 5:
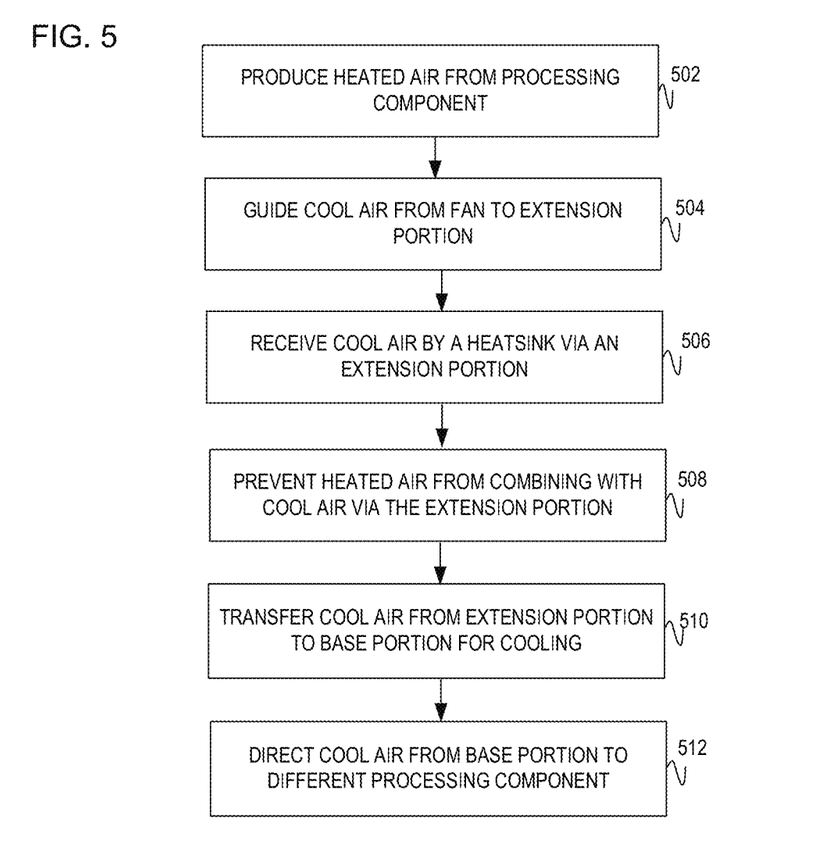

Referring now to FIGS. 4 and 5, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated.

FIG. 4 is a flow diagram illustrating a method of transferring cool air from an extension portion of heatsink to the base portion. The transfer of the cool air to the base portion allows the heatsink to cool components located in posterior position. The method as illustrated in FIG. 4 may be performed by a cooling system including components such as heatsink 106 as in FIG. 1A. The heatsink includes both the extension portion 106 and base portion 108. The extension portion receives cool air above a different heatsink (e.g., first heatsink). Based on receiving the cool air, the extension portion guides the cool air to the base portion for cooling components in the posterior location to the different heatsink. In discussing FIG. 4, operations 402-406 may be performed by components in FIGS. 1-3. As such, references may be made to such components for purposes of clarification and not to limit such implementations. For example, first heatsink 104 may operate in conjunction with extension portion 108 and base portion 110 of second heat sink 106 to effectively cool multiple processing components which may be positioned in a posterior location to one another.

At operation 402, the heatsink (e.g., second heatsink) receives cool air via the extension portion. The cool air is an airflow generated by a fan and pushed by the fan to the extension portion of the heatsink. In this implementation, the cool air produced by the fan may generate two cool airflows which may be simultaneously received by the extension portion and a different heatsink positioned under the extension portion. Simultaneously receiving the cool airflows, prevents the heated air produced by a processing component to mix or combine with the cool air received by the extension portion. Through the intake of cool air by extension potion partitions the cool air such that the heated air produced by upstream components does not mix with downstream components.

At operation 404, based on receiving the cool air from the fan, the extension portion prevents the combination of the heated air produced by the processing component and the received cool air. In one implementation the extension portion which is located above the processing component, receives the cool air simultaneously with another heatsink above the processing component. Receiving the cool air simultaneously from the fan, the cool air moves across the extension portion of the heatsink to reach the base portion for cooling the different processor. The different processor location is considered in a posterior location to processing component. In this implementation, the different processing component is considered in a downstream of preheated air from the processing component. Thus, by moving cool air across the extension portion and reaching the base portion, the heatsink comprising these portions brings cool air to the different processing component in the downstream location.

At operation 406, the extension portion guides the cool air to the base portion for cooling purposes. The base portion receives the cool air and upon receiving the cool air, the base portion may absorb of transfer the heat produced from the different processing component. Receiving the cool air allows the base portion of the heatsink to transfer the heat from the different processing component. Absorbing or transferring the heated air from the different processing component allows the base portion to regulate the temperature of the component.

FIG. 5 is flow diagram illustrating a method of cooling multiple processing components with each respective heatsink. In discussing FIG. 5, operations 502-512 may be performed by components in FIGS. 1-3. As such, references may be made to such components for purposes of clarification and not to limit such implementations. For example, first heatsink 104 may operate in conjunction with extension portion 108 and base portion 110 of second heatsink 106 to effectively cool multiple processing components which may be positioned in a posterior location to one another.

At operations 502-504 heat is produced by at least a processing component within a server. An airflow may guide cool air from a fan to various heatsinks of a cooling system. Specifically, a first heatsink and a second heatsink via the extension portion may receive the cool air. The extension portion may be located directly above the first heatsink, thereby enabling both the extension portion and the first heatsink to simultaneously receive the cool air. Upon receiving the cool air, the first heatsink transfers heat from the processing component while the cool air may move across the extension portion to reach a base portion of the second heatsink.

At operation 506, the second heatsink receives cool air from the fan via the extension portion. In one implementation the first heatsink, positioned below the extension portion, receives cool air. Receiving the cool air via the extension portion divides the cool air between the first heatsink and the second heatsink ensuring cool air may also be delivered to another processing component in a downstream of air. Upon receiving the cool air, the extension portion may guide the cool air to the base portion of the second heatsink for cooling the different processing component. Operation 506 may be similar in functionality to operation 402 as in FIG. 4.

At operation 508 through receipt of the cool air via the extension portion, prevents the heated air produced by the processing component from combining with the cool air. The extension portion provides a separate channel for the second heatsink to receive the cool air which prevents the cool air from mixing with the heated air. Operation 508 may be similar in functionality to operation 404 as in FIG. 4.

At operation 510, based on the extension portion receiving the cool air, the base portion receives the cool air. Receiving the cool air, the base portion absorbs the heated from the different processing component. The base portion is located directly above the different processing component to transfer the heat produced from the different processing component. Operation 510 may be similar in functionality to operation 406 as in FIG. 4.

At operation 512, the second heatsink may direct the cool air from the base portion to the different processing component for cooling purposes.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. A cooling system within a server including processing components, the cooling system comprising:
    a first heatsink positioned above a processing component within the server; and
    a second heatsink including:
        a first portion extending above the first heat sink and the first processing component with space in between the first heatsink and the first portion, the first portion to:
            receive cool air such that the first portion extending above the processing component and the first heatsink prevents heated air produced by the processing component to combine with the cool air; and
        a second portion coupled to the first portion to:
            receive the cool air from the first portion; and
            transfer the cool air to a different processing component within the server located in a posterior position to the processing component.

2. The cooling system of claim 1 comprising:
    a fan positioned near a front of the server, to provide cool air to the first heatsink and the second heatsink via the first portion.

3. The cooling system of claim 2 further comprising:
    an airflow guide to:
        receive the cool air from the fan; and
        guide the cool air to the first heatsink and the first portion of the second heatsink.

4. The cooling system of claim 1 wherein the first heatsink reaches a height of 1 U and the second heatsink reaches a height of 2 U.

5. The cooling system of claim 1, wherein the second portion is positioned above the different processing component.

6. The cooling system of claim 1, wherein the processing component is selected from a group of components including an integrated circuit, a semiconductor, a memory module, a central processing unit, a processing resource, an application-specific integrated circuit, a controller, a processor, and a chipset.

7. The cooling system of claim 1, wherein the different processing component is selected from a group of components including an integrated circuit, a semiconductor, a memory module, a central processing unit, a processing resource, an application-specific integrated circuit, a controller, a processor, and a chipset.

8. A heatsink comprising:
    an extension portion to:
        extend above a processing component to a fan, such that the extension prevents heated air produced by the processing component to combine with cool air from the fan; and
    a base portion, coupled to the extension portion, to:
        receive cool air from the fan via the extension portion; and
        transfer heat from a different processing component in a posterior location to the processing component,
        wherein the extension portion extends from the base portion and above a different heatsink located on top of the processing component with space in between the extension portion and the different heatsink.

9. The heatsink of claim 8 wherein the base portion reaches a height of at least 2U.

10. The heatsink of claim 8 wherein the base portion is positioned above the different processing component.

11. The heatsink of claim 8, wherein the processing component is selected from a group of components including an integrated circuit, a semiconductor, a memory module, a central processing unit, a processing resource, an application-specific integrated circuit, a controller, a processor, and a chipset.

12. The heatsink of claim 8, wherein the different processing component is selected from a group of components including an integrated circuit, a semiconductor, a memory module, a central processing unit, a processing resource, an application-specific integrated circuit, a controller, a processor, and a chipset.

13. A method to cool processing components within a server, the method comprising:
- receiving cool air via an extension portion of a heatsink;
- preventing a combination of heated air produced by a processing component and the cool air received via the extension portion of the heatsink, the extension portion located above a different heatsink above the processing component, with space in between the different heatsink and the extension portion; and
- transferring the cool air from the extension portion to a base portion of the heatsink for cooling a different processing component in a posterior position to the processing component.

14. The method of claim 13 comprising:
- guiding cool air from a fan to the extension portion of the heatsink; and
- receiving the cool air by the extension portion and the different heatsink.

15. The method of claim 13 comprising:
- producing the heated air by the processing component.

16. The method of claim 13 wherein extending the extension portion of the heatsink above the processing component comprises:
- directing the cool air from the base portion to the different processing component for cooling purposes.

17. The method of claim 13, wherein the base portion is positioned above the different processing component.

18. The method of claim 13, wherein the processing component is selected from a group of components including an integrated circuit, a semiconductor, a memory module, a central processing unit, a processing resource, an application-specific integrated circuit, a controller, a processor, and a chipset.

19. The method of claim 13, wherein the different processing component s selected from a group of components including an integrated circuit, a semiconductor, a memory module, a central processing unit, a processing resource, an application-specific integrated circuit, a controller, a processor, and a chipset.

* * * * *